United States Patent [19]

Kitajima et al.

[11] 4,039,358
[45] Aug. 2, 1977

[54] METHOD OF MANUFACTURING AN INSULATED GATE TYPE FIELD EFFECT SEMICONDUCTOR DEVICE

[75] Inventors: Motohiro Kitajima; Yoshihiko Nakagawa, both of Aizu Wakamatsu, Japan

[73] Assignee: Toko Incorporated, Tokyo, Japan

[21] Appl. No.: 721,211

[22] Filed: Sept. 8, 1976

[30] Foreign Application Priority Data

Sept. 8, 1975    Japan .................................. 50-108758

[51] Int. Cl.² .......................................... H01L 21/22
[52] U.S. Cl. ............................ 148/187; 148/1.5; 357/23
[58] Field of Search ............... 148/187, 1.5; 357/23

[56] References Cited

U.S. PATENT DOCUMENTS

| | | | |
|---|---|---|---|
| 3,447,238 | 6/1969 | Heynes et al. | 29/590 |
| 3,544,858 | 12/1970 | Kooi | 357/23 |
| 3,600,241 | 8/1971 | Doo et al. | 148/175 |
| 3,676,921 | 7/1972 | Kooi | 29/571 |
| 3,725,151 | 4/1973 | Zoroglu | 148/187 |
| 3,752,711 | 8/1973 | Kooi et al. | 148/33.3 |
| 3,761,327 | 9/1973 | Harlow et al. | 148/187 |
| 3,893,152 | 7/1975 | Lin | 357/23 |
| 3,926,715 | 12/1975 | Sussmann | 156/612 |
| 3,986,903 | 10/1976 | Watrous | 148/187 |

OTHER PUBLICATIONS

Trans. of the Met. Soc. of A.I.M.E., vol. 233, Mar. 1965, pp. 596–602.

*Primary Examiner*—G. Ozaki

[57] ABSTRACT

A method of manufacturing an insulated gate type field effect semiconductor device, wherein before an oxide film for the gate is formed, the surface portion of the silicon substrate is removed which includes defect such as scar, crack, distortion, dislocation or the like which tends to cause pin-holes to be formed in said oxide film.

3 Claims, 2 Drawing Figures

METHOD OF MANUFACTURING AN INSULATED GATE TYPE FIELD EFFECT SEMICONDUCTOR DEVICE

BACKGROUND OF THE INVENTION

1. Field of the Invention

This invention relates to a method of manufacturing insulated gate type field effect semiconductor devices by selective oxidation process.

2. Description of the Prior Art

To cope with the recent trend that the integration degree of a large scale integrated circuit device increases more and more, effect has been made to reduce pattern size of such device and prevent breaking of metal layer wiring thereof. To this end, it has been proposed to manufacture such a type of semiconductor device by so-called selective oxidation process wherein oxide film is selectively formed only on desired portions of the substrate surface and part of such oxide film is buried in the substrate. In such a conventional method, however, there is the tendency that defect, such as scar, crack, distortion, dislocation or the like is caused to occur in the substrate surface during elimination of silicon nitride film which is formed in the course of the manufacturing process; due to such defect, the breakdown voltage of the resulting device is decreased.

SUMMARY OF THE INVENTION

It is an object of this invention to provide a novel and improved method of manufacturing insulated gate type field effect semiconductor devices by selective oxidation process, which is free from the above-mentioned drawbacks of the conventional method. Thus, according to this invention, it is possible to produce highly reliable semiconductor devices of the above-described type and increase yield of such devices.

Other objects, features and advantages of this invention will become apparent from the following description taken in conjunction with the accompanying drawings.

DESCRIPTION OF THE PREFERRED EMBODIMENT

Figure 1:
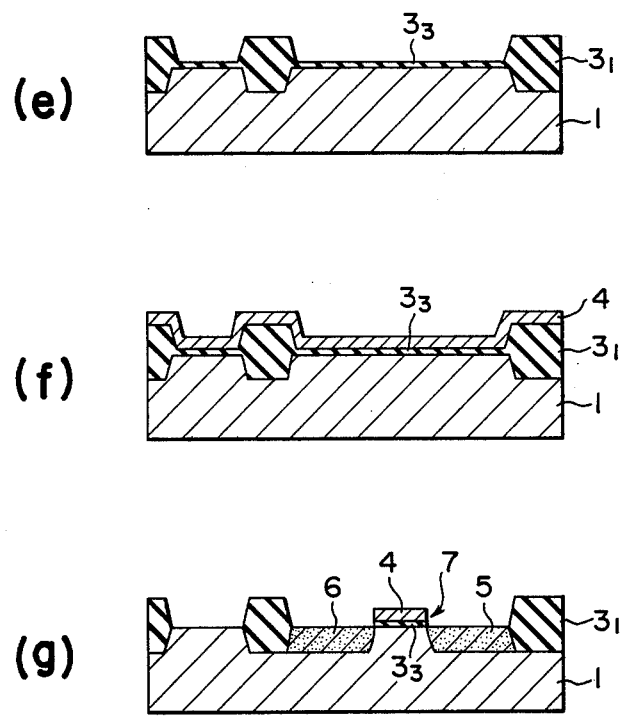
FIG. 1 is a schematic sectional view illustrating the various steps of the process according to an embodiment of this invention.

The method according to an embodiment of this invention will now be described with reference to the drawings. In this method, a silicon nitride film 2 having a thickness of 0.12 to 0.2 $\mu$ for example is first deposited on the surface of a silicon substrate 1, and thereafter such a film 2 is partially removed by means of etching, leaving those portions thereof which cover active areas of the substrate surface in which are to be formed a source 6, gate 7, drain 5 (see FIG. 1(g)) and any other circuit element or elements, as shown in FIG. 1(a). Subsequently, the substrate is subjected to oxidization in a wet oxygen atmosphere (which includes oxygen passed through hot water of 95° C) at 1100° C for 10 hours, so that an oxide film $3_1$ having a thickness of 2.0 $\mu$ for example is formed in inactive areas of the substrate 1 which are not covered with the silicon nitride film 2, as shown in FIG. 1(b). In this case, the oxide film $3_1$ is partially buried in the silicon substrate 1 as deep as half the thickness thereof, due to the oxidization of the substrate per se by the heating oxidization process. The silicon nitride film 2 also has its surface slightly oxidized so that an oxide film $3_2$ is formed, but the underlying surface portions of the silicon substrate 1 will not be oxidized. Thereafter, the silicon nitride film 2 and oxide film $3_2$ are removed by means of hot phosphoric acid so that the active areas of the silicon substrate 1 are exposed, while the oxide film $3_1$ partially buried in the substrate is left in the inactive areas, as shown in FIG. 1(c).

In the prior-art technique, the substrate 1 as shown in FIG. 1(c) is subjected to second heating oxidization to form a thin oxide film $3_3$ for the gate 7, as shown in FIG. 1(e), and thereafter polycrystalline silicon film 4 is deposited or grown onto the oxide film $3_3$, as shown in FIG. 1(f). Subsequently, the oxide film $3_3$ and polycrystalline silicon film 4 are shaped in the gate form, and then boron is diffused into the active area to form the source 6 and drain 5.

Figure 2:
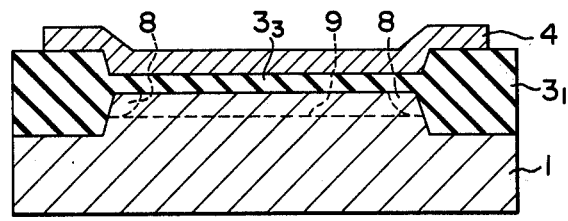
FIG. 2 is a schematic sectional view showing an insulated gate type field effect semiconductor device produced in accordance with the prior-art technique.
Figure 1:
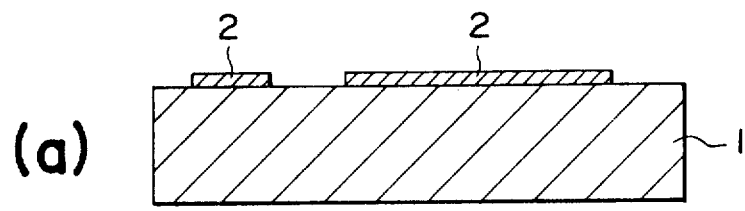
Figure 1:
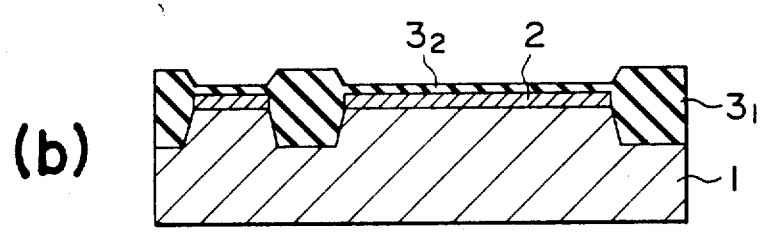
Figure 1:
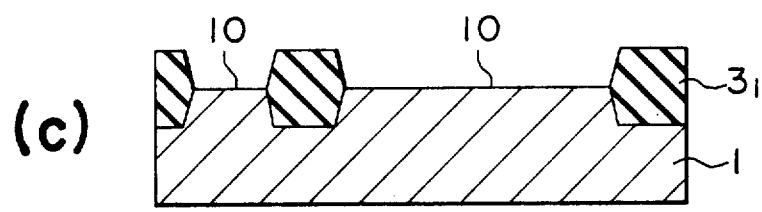
Figure 1:
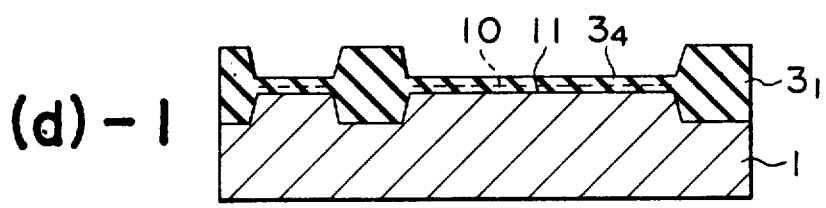
Figure 1:
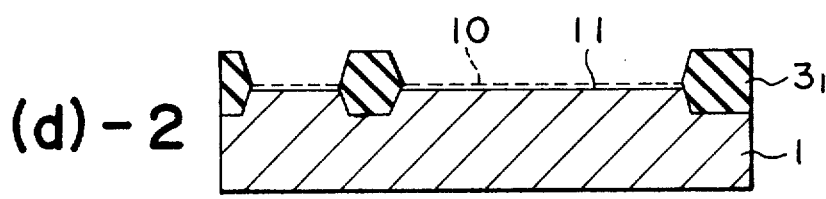

As is well known in the art, however, when the substrate 1 is subjected to the high-temperature heat treatment with the silicon nitride film 2 in direct contact with the surface of the substrate as described above in connection with FIG. 1(b), defect such as scar, crack, distortion, dislocation or the like is inevitably caused to occur in the surface portion of the substrate as shown at 8 in FIG. 2 which is a sectional view of the gate 7 shown in FIG. 1(g) and which is taken along a plane perpendicular to the paper of the drawing. Hence, in case the oxide film $3_3$ as shown in FIG. 1(e) is formed on the exposed surface 10 (FIG. 1(c)) of the substrate 1 where the aforementioned defect still exists as is the case with the above-described conventional method, then such oxide film $3_3$ will be adversely affected by the defect 8 in the substrate surface portion which is in contact with the partially buried oxide film $3_1$, so that pin-holes and/or other defect will be caused to occur in the oxide film $3_3$. Disadvantageously, the formation of such a defective oxide film $3_3$ will inevitably lead to deterioration in quality such as decrease in the breakdown voltage of the resulting device and poor yield thereof.

The present invention is intended to eliminate the aforementioned disadvantage of the prior-art technique. In accordance with this invention, before forming the oxide film $3_3$ shown in FIG. 1(e) on the exposed surface 10 of the substrate 1 shown in FIG. 1(c), the surface portion of the substrate 1 where the aforementioned defect 8 (FIG. 2) exists is removed, together with such defect, by means of etching. Preferably, the silicon substrate 1 shown in FIG. 1(c) is subjected to heating oxidization treatment so that that surface portion of the silicon substrate 1 which includes the aforementioned defect 8 is thereby changed to an oxide film $3_4$. It is to be noted here that as shown at 11 in FIG. 1(d)-1, the oxide film $3_4$ extends into the substrate slightly beyond a dotted line 10 which corresponds to the exposed surface 10 shown in FIG. 1(c). In this case, almost no oxidization proceeds in the inactive areas of the substrate 1 since such areas are covered with the oxide film $3_1$. Subsequently, the oxide film $3_3$ is etched off by using fluoric acid group etching liquid so that the surface portion of the substrate with the aforementioned defect is completely eliminated, as shown in FIG. 1(d)-2 wherein reference numeral 11 indicates the newly exposed surface of the active areas of the substrate 1. Thereafter, the step shown in FIG. 1(d)-2 is followed by the steps as shown in FIGS. 1(e) to (g). Although not shown, protective oxide film and aluminum wiring pattern are also provided as desired; thus the silicon gate type field effect semiconductor device embodying this invention is produced.

As will be appreciated from what has been described above, in accordance with this invention, defect such as shown at 8 in FIG. 2 can be completely eliminated which inevitably occurs in the prior-art device, simply by effecting one or two additional simple steps such as described above in connection with FIGS. 1(d)-1 and (d)-2; thus, there is no need either to finely adjust the thickness of the silicon nitride film 2 or provide an additional oxide film between the surface of the substrate 1 and the silicon nitride film 2 to avoid occurrence of the aforementioned defect as is the case with the prior-art technique.

It will readily be apparent to those skilled in the art that this invention is equally applicable to the manufacture of a metal gate type field effect semiconductor device wherein the gate portion thereof is provided with a film of metal such as aluminum instead of the polycrystalline silicon film 4.

While this invention has been described and illustrated with respect to specific embodiments thereof, it is to be understood that the foregoing description is only exemplary of the invention and various modifications and changes may be made therein within the spirit and scope of the invention as defined in the appended claims.

We claim:

1. A method of manufacturing an insulated gate type field effect semiconductor device, which includes the steps of providing a silicon nitride film on the surface of a silicon substrate, selectively removing said silicon nitride film so as to define an exposed inactive area or areas and a non-exposed active area or areas in which at least the source, gate and drain of said semiconductor device are formed, forming an oxide film on the surface of said exposed inactive area or areas, and forming the gate comprising an oxide film in contact with the surface of said substrate and an overlying polycrystalline silicon or metal film and diffused source and drain, characterized by inclusion of the step of removing the surface portion of the substrate which includes defect in said active area or areas, after said step of removing said silicon nitride film is performed and before the step of forming the oxide film for said gate is carried out.

2. A method according to claim 1, wherein the elimination of said surface portion is effected by means of etching.

3. A method according to claim 1, wherein said surface portion is removed by using fluoric acid group etching liquid after said surface portion has been changed to an oxide film by subjecting said substrate to heating oxidization treatment.

* * * * *

UNITED STATES PATENT OFFICE
CERTIFICATE OF CORRECTION

Patent No. 4,039,358                    Dated August 2, 1977

Inventor(s) Motohiro Kitajima et al.          Page 1 of 2

It is certified that error appears in the above-identified patent and that said Letters Patent are hereby corrected as shown below:

The sheet of drawing as shown on the attached sheet should be inserted as sheet 1 of the drawing figures.

Signed and Sealed this

Twentieth Day of December 1977

[SEAL]

Attest:

RUTH C. MASON  
Attesting Officer

LUTRELLE F. PARKER  
Acting Commissioner of Patents and Trademarks (a)

(b)

(c)

(d)-1

(d)-2